US005744967A

United States Patent [19]
Sorensen

[11] Patent Number: 5,744,967
[45] Date of Patent: Apr. 28, 1998

[54] APPARATUS FOR DETECTING INTERMITTENT AND CONTINUOUS FAULTS IN MULTIPLE CONDUCTOR WIRING AND TERMINATIONS FOR ELECTRONIC SYSTEMS

[76] Inventor: Brent A. Sorensen, 1801 W. 2100 South, West Haven, Utah 84401

[21] Appl. No.: 518,749

[22] Filed: Aug. 24, 1995

[51] Int. Cl.$^6$ ................................................. G01R 31/02
[52] U.S. Cl. ........................................ 324/540; 324/539
[58] Field of Search ................................. 324/539, 540, 324/73.1, 66

[56] References Cited

U.S. PATENT DOCUMENTS

| | | | |
|---|---|---|---|
| 3,842,346 | 10/1974 | Bobbitt | 324/522 |
| 4,380,805 | 4/1983 | Proebsting | 324/158.1 X |
| 4,819,038 | 4/1989 | Alt | 324/765 X |
| 4,922,184 | 5/1990 | Rosenstein et al. | 324/72.5 |
| 5,187,680 | 2/1993 | Engeler | 364/807 |
| 5,218,440 | 6/1993 | Mathur | 358/213.27 |

OTHER PUBLICATIONS

"Introducing Analysis Tech", Anatech, pp. 1–10 (no date available).
Neural Computing, NeuralWorks Professional II/Plus and NeuralWorks Explorer, NeuralWare in 1991, pp. NC4–NC7 (no month available).

*Primary Examiner*—Glenn W. Brown
*Attorney, Agent, or Firm*—Mallinckrodt & Mallinckrodt

[57] ABSTRACT

A latching tester for testing continuity of wires in a system has an array of pin electronics cells, where each pin cell couples a signal to a row sense line and a column sense line when a change in current flow through a pin occurs; apparatus for detecting the signal on the row sense line; and apparatus for detecting the signal on the column sense line. The array of pin electronics cells may also operate as a capacitively coupled neural network, where a signal coupled onto the row and column lines from a stimulus line varies with the load on each pin of the pin electronics cells. An alternate mode of operation permits stimulus of the network and attached loads, and generation of a signature based upon the response of the network to the stimulus, as observed on the row and column sense lines. In yet another mode of operation, the tester may serve to recognize particular signals.

19 Claims, 10 Drawing Sheets

APPARATUS FOR DETECTING INTERMITTENT AND CONTINUOUS FAULTS IN MULTIPLE CONDUCTOR WIRING AND TERMINATIONS FOR ELECTRONIC SYSTEMS

BACKGROUND OF THE INVENTION

1. Field of the Invention

The present application pertains to apparatus for the detection of faults in multiple conductor wiring for electronic systems. The apparatus has operating modes for detecting both constant faults and intermittent faults. The apparatus may also be useful for analysis of multiple concurrent signals.

2. State of the Art

Many existing vehicle and aircraft designs incorporate numerous separate wires connecting the various electrical and electronic devices in the vehicle system. Generally, these multiple wires are tied together into a wiring harness, which may often contain dozens of wires.

Aircraft electronics systems have particularly large numbers of wires interconnecting the aircraft electronic devices. Even a transponder may have thirteen wires connecting to an altitude encoder, and another fifteen connecting to a remote control head, for a total of almost 30 wires. Other aircraft electronics devices often connect to many more wires than this.

Vehicle and aircraft wiring systems are generally subjected to vibration and corrosive atmospheres. As a result, they often develop flawed connections. Flawed connections may be constant, or may be intermittent.

Constant faults are fairly easy to identify and fix, because the fault remains present while a technician traces the circuitry to locate the fault. Intermittent faults are hard to diagnose and repair because they occur with some randomness, and then may occur only under conditions of system stress. Even when an intermittent fault occurs while a system is under stress at a repair facility, the fault can often be diagnosed only when the fault occurs while an instrument is monitoring the faulty connection because intermittent faults often are present in the system for only a short time, too short a time to allow tracing of circuitry to locate the problem.

A method for diagnosing intermittent faults in wiring harnesses or vehicle electronic systems including wiring harnesses is for a technician to attach a latching continuity tester to each wire of the harness. The vehicle, or harness, is then stressed by vibration, heating, or cooling such that any intermittently flawed connection in the wiring will, at least momentarily, fail. The latching continuity tester detects the momentary fault, and latches the identity of the momentary fault. The tester then provides the identity of the failed connection to the technician.

A similar technique can be employed on a printed circuit card, or complete electronic module. A multichannel continuity tester is attached to the card or module, the module is then stressed. Any momentary failures are latched by the tester.

A multichannel latching continuity tester is presently produced by Anatech, P.O. Box 326, Wakefield, Mass., 01880.

The apparatus of U.S. Pat. No. 4,922,184, issued to Rosenstein in 1990, is a multichannel latching continuity tester having a separate comparator circuit for each channel, as is the thermal intermittent tester of U.S. Pat. No. 3,842,346, issued to Bobbitt in 1974.

The data input and output terminations of many common electronics modules have signal levels ranging from 0 to 5 volts. Most of these modules have a TTL or CMOS integrated circuit connected to each of these signal terminations. TTL and CMOS integrated circuits generally have a parasitic diode connection between the signal termination and ground. This diode becomes forward biased when the signal termination is driven negative with respect to ground, clamping the signal termination to a level of typically −0.7 volt. This parasitic diode is commonly utilized in testing continuity of devices during the integrated circuit manufacturing process.

Signature testing has become popular for testing electronic apparatus. A signature tester monitors the performance of a circuit subjected to a repeatable stimulus, and computes a pattern or number, or signature, corresponding in some way to the response of the circuit. For very simple circuits, the signature may comprise the entire response of the circuit. For larger circuits having a more complex response, the signature bit pattern is generally substantially smaller than the entire circuit response. The signature is computed through a hashing algorithm such that all good circuits have the same signature, but most, if not all, defective circuits have different signatures. Once computed, the signature derived from the circuit under test is compared with the signature of a known good circuit.

Signature testers have heretofore been used primarily on digital circuits.

Neural networks have recently become popular for many applications. A typical neural network incorporates a plurality of analog or digital computing elements, known as neuromimes, each of which emulates the function of a neuron by performing mathematical operations such as summation, greater than, maximum, or the like. For example, a neuromime may perform a summation. The summation is usually a summation of the products of weighting factors and input levels, and is a weighted sum of the input levels. The computing element, or simulated neuron, generates an output signal that varies with the sum, as illustrated in the figure on page NC-5 of *Neural Computing, NeuralWorks Professional II/Plus and Neural-Works Explorer*, published by NeuralWare in 1991. The overall function of the neuron is the response function of the neuron.

Each input signal to a biological neuron occurs at a synapse, or junction of one neuron with another. Neuromimes also effectively have a synapse, the portion of their hardware or software that couples an input signal into the response function of the neuromime.

While neuromimes generally provide an all or nothing thresholded response in response to the weighted sum of the input signals, other response functions are possible. A neuromime may have an analog output, limited or not, or may generate a pulse-width or pulse-rate modulated output. A neuromime may also respond to a logical function.

While neuromimes may be built in hardware, they may also be simulated in a digital computer. The neural network, or network of neuromimes, is generally trained on multiple known patterns of input and output signals. Training may, but need not, be based upon the back propagation technique. Training adjusts the weights of the sums such that when the network is presented with the training patterns the network provides the desired known output signals. A trained network may then generate appropriate output signals when presented with additional patterns.

U.S. Pat. No. 5,187,680, issued to Engeler in February, 1993, describes a capacitively coupled neural network, where each input is a pulse presented to an array of capacitors. The capacitors couple the input pulse onto a plurality of sense lines, thereby forming the synapses, each pair of sense lines feeding a differential sense amplifier. Each sense amplifier has an inhibitory and an exitory sense line. The signal at the sense amplifier is proportional to the input signal multiplied by weighting factors, where the weighting factors are the differences in capacitances between the capacitors coupling each input signal onto the inhibitory sense line, and the capacitors coupling the signal onto the exitory sense line.

SUMMARY OF THE INVENTION

The present invention comprises a neural network wherein the weighting factors of each synapse depend upon the characteristics of any external loading applied to a pin of each synapse. The invention further comprises apparatus for stimulating the network, and for monitoring a response of the network to the stimulus. The response of the network to the stimulus provides information about the loading applied to the pins that is useful in such applications as testing or analyzing a system of which the external loads form a part.

The network of the present invention operates as a tester capable of operating as a multichannel latching continuity tester. The tester of the present invention comprises an array of pin interface circuits each comprising a couple of resistors and capacitors, together with row and column sense electronics including latches and comparators. The array is so organized that if a pin interface circuit is attached to a wire of a wiring harness, and a change in continuity occurs on that wire, the faulty wire is identified to a microprocessor, which displays the discrepancies to a technician.

The tester of the present invention can also be operated in a static continuity test mode. In this mode, each row of the array is probed to determine which pin interface circuits of that row are connected to a continuous circuit in the system being tested. The resulting pattern of open and connected lines can be compared to a known good pattern, and any discrepancies identified by the microprocessor.

The tester may also be operated in a signature analysis mode, wherein a signature pattern is created that depends upon the pattern of diodes, resistances and capacitances in the system wiring under test. Any significant variations between the signature pattern generated from the system, and a known good signature pattern in the microprocessor's memory, are then identified to the technician. The microprocessor can also search its memory, using software neural network techniques, for signatures in its memory that most closely match the signature pattern generated from the system being tested.

Finally, the tester of the present invention may also be operated to perform analysis of, and matching of, a signal presented to the tester.

BRIEF DESCRIPTION OF THE DRAWINGS

The best mode presently contemplated for carrying out the invention is illustrated in the accompanying drawings, in which.

DETAILED DESCRIPTION OF THE INVENTION

Figure 1:
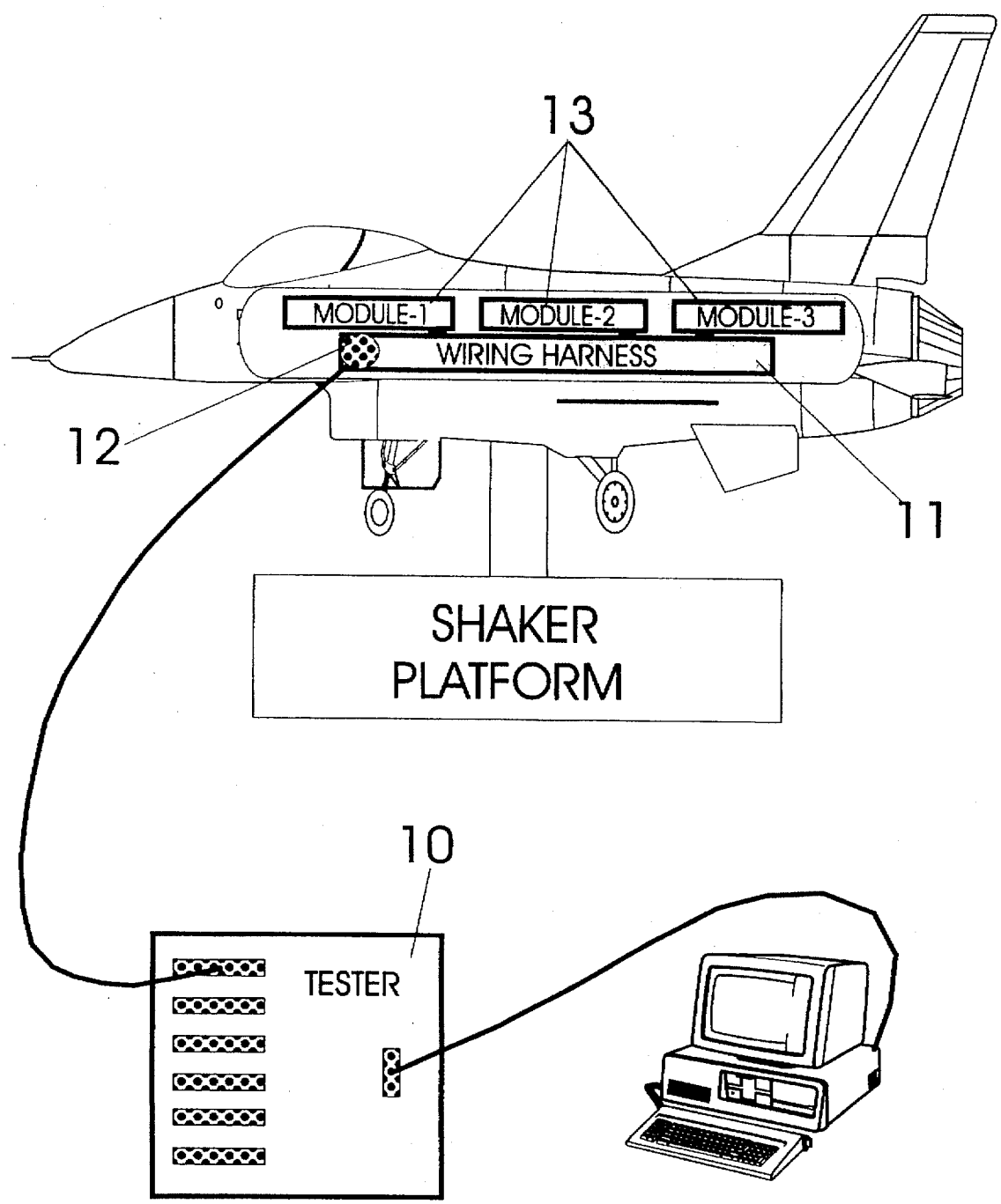
FIG. 1 is a schematic of a system wherein the tester of the present invention is used to identify intermittent connections and verify proper wiring.

An electronic system is tested by connecting the tester 10 of the present invention to a plurality of wires in the wiring harness 11 of the system, as shown in FIG. 1. The tester may be connected to a test connector 12 of the wiring harness 11, or may be connected in place of one of the electronic modules 13 of the system.

The wiring harness 11 connects to the pin electronics array 15 of the tester (FIG. 2), which has sixteen X sense lines 17 and sixteen Y sense lines 16. Also connected to the array 15 are a set of X amplifiers 20 feeding X comparators 21, and a set of Y amplifiers 22 feeding Y comparators 23. The X comparators 21 are readable by the host microcomputer 25 and feed an X encoder 24. Similarly, the Y comparators 23 are readable by the host microcomputer 25 and feed a Y encoder 26. The X encoder 24 and Y encoder 26 are readable by host microcomputer 25, and both encoders feed an event latch 27, which is also readable by the host microcomputer 25.

Figure 2:
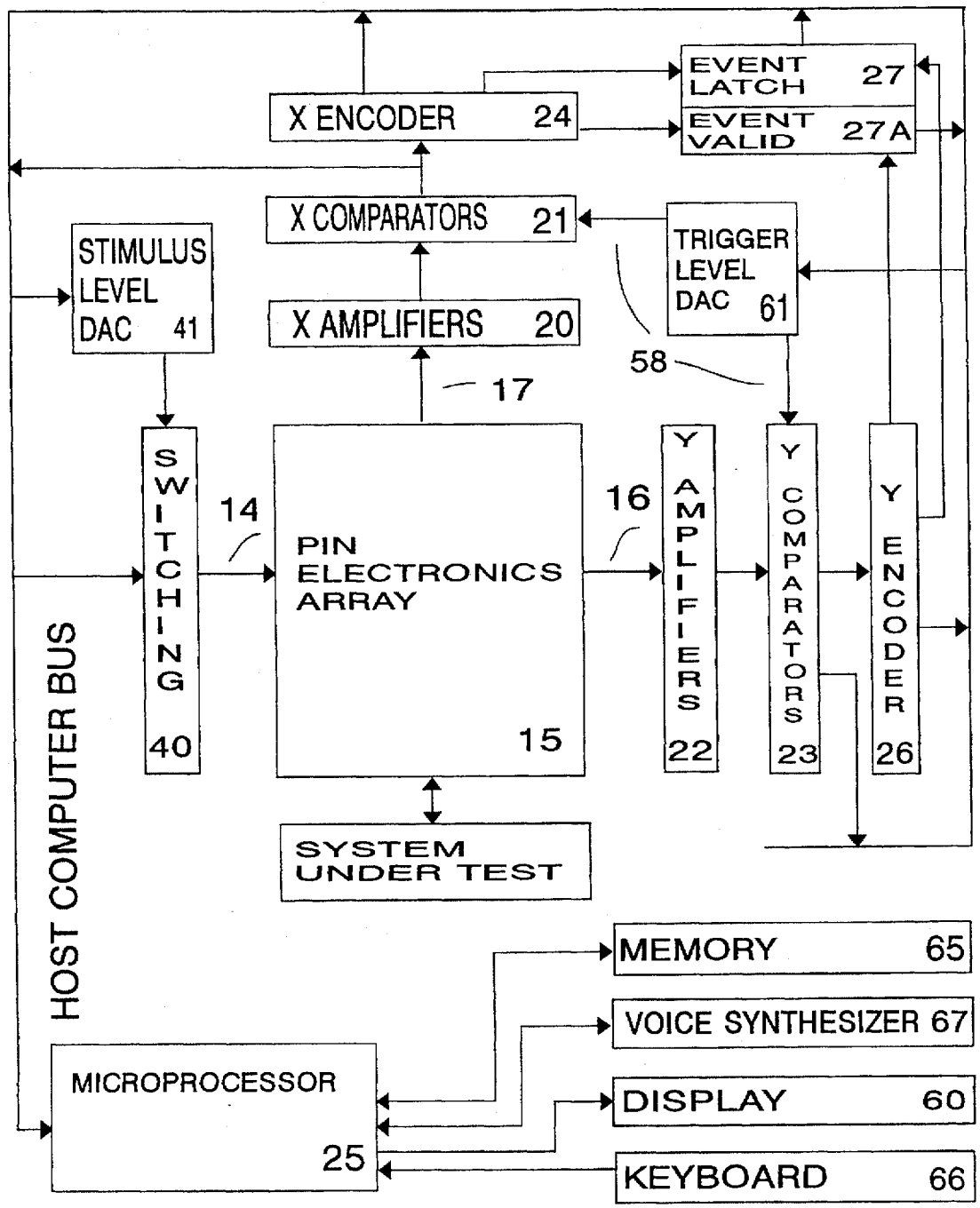
FIG. 2, a block diagram of the tester of the present invention.
Figure 3:
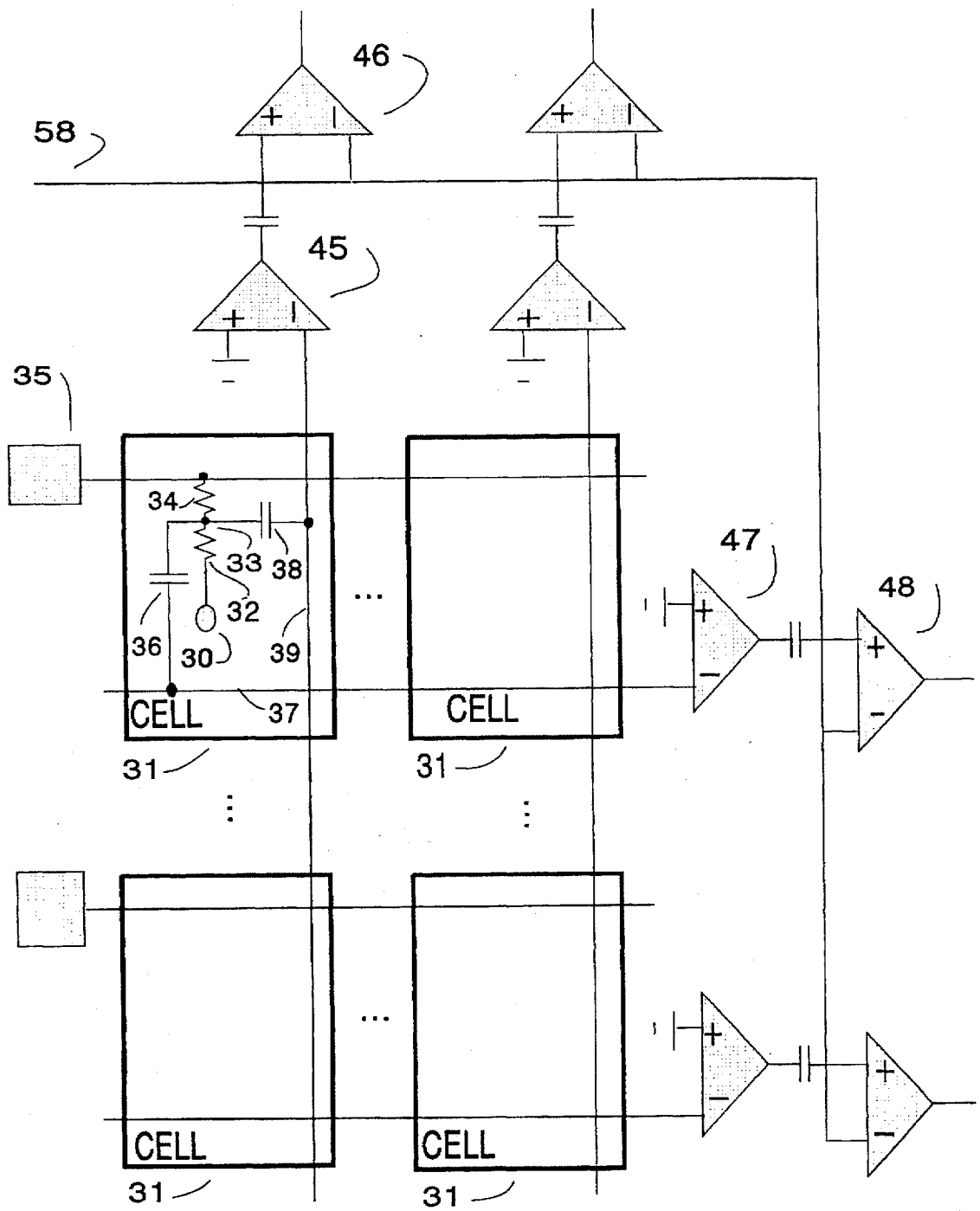
FIG. 3, a partial schematic of the pin electronics array of the present invention.

The wiring harness 11 comprises a plurality of individual wires. Those wires in the harness that are under test are connected to a pin, such as pin 30 (FIG. 3), of pin electronics circuit 31 in pin electronics array 15 (FIG. 2). Each pin electronics circuit 31 comprises a 4.7K resistor 32 connected from pin 30 to a node 33. Also connected to node 33 is a 47K resistor 34 to a row stimulus line 35, a 0.02 microfarad capacitor 36 to a row sense line 37 of Y sense lines 16, and a 0.02 microfarad capacitor 38 to a column sense line 39 of X sense lines 17.

Each row stimulus line of stimulus lines 14 (FIG. 2), such as row stimulus line 35 (FIG. 3), connects through a single pole, double throw, electronic switching device of switching circuitry 40 (FIG. 2) to ground, or to a voltage controlled by a stimulus voltage Digital to Analog Converter (DAC) 41. The presently preferred embodiment incorporates an array of 256 pin electronics cells 31, each being connected to one of the sixteen column (X) sense lines 17 and to one of the sixteen row (Y) sense lines 16. Sixteen of these cells 31 are connected to each of the sixteen column (X) sense lines 17, and sixteen are connected to each of the sixteen row (Y) sense lines 16.

The tester is capable of being operated as a multichannel continuity tester responsive to momentary open circuits. In this mode of operation, each row stimulus line of stimulus lines 14 is driven to a specific voltage, normally −2.5 volts. This voltage causes a current to flow through resistors 32 and 34 of each pin electronics circuit, and through the parasitic diodes of any electronics devices attached to the wiring harness. Typically, the voltage upon the wire is clamped to −0.7 volts, and the voltage at each node 33 therefore becomes approximately −0.9 volts.

Some or all of the electronics modules of a system may be replaced with a connector having a short-circuit to ground for test purposes. When this is done, the voltage on each wire is clamped to 0 volts, and the voltage at node 33 is about −0.2 volt.

When vibration, such as from a technician shaking the wiring harness or produced by a shaker table, temperature excursions, bending moments or other stresses applied to the system produce an open circuit on any of the wires under test, current ceases to flow through resistor 32 of the pin electronics circuit attached to that defective wire. As a result, the voltage at node 33 changes, moving in the direction of the applied row stimulus voltage, or typically towards −2.5 Volt. This change, or signal, couples through the capacitors 36 and 38 into the row (Y) and column (X) sense lines 37 and 39 attached to the pin electronics cell attached to the wire on which the event occurred, causing a signal thereon.

The signal on the X sense line 39 is amplified by the associated X sense amplifier 45, and applied to the associated X comparator 46. Similarly, the signal on the Y sense line 37 is amplified by the associated Y sense amplifier 47 and applied to the associated Y comparator 48.

Figure 4:
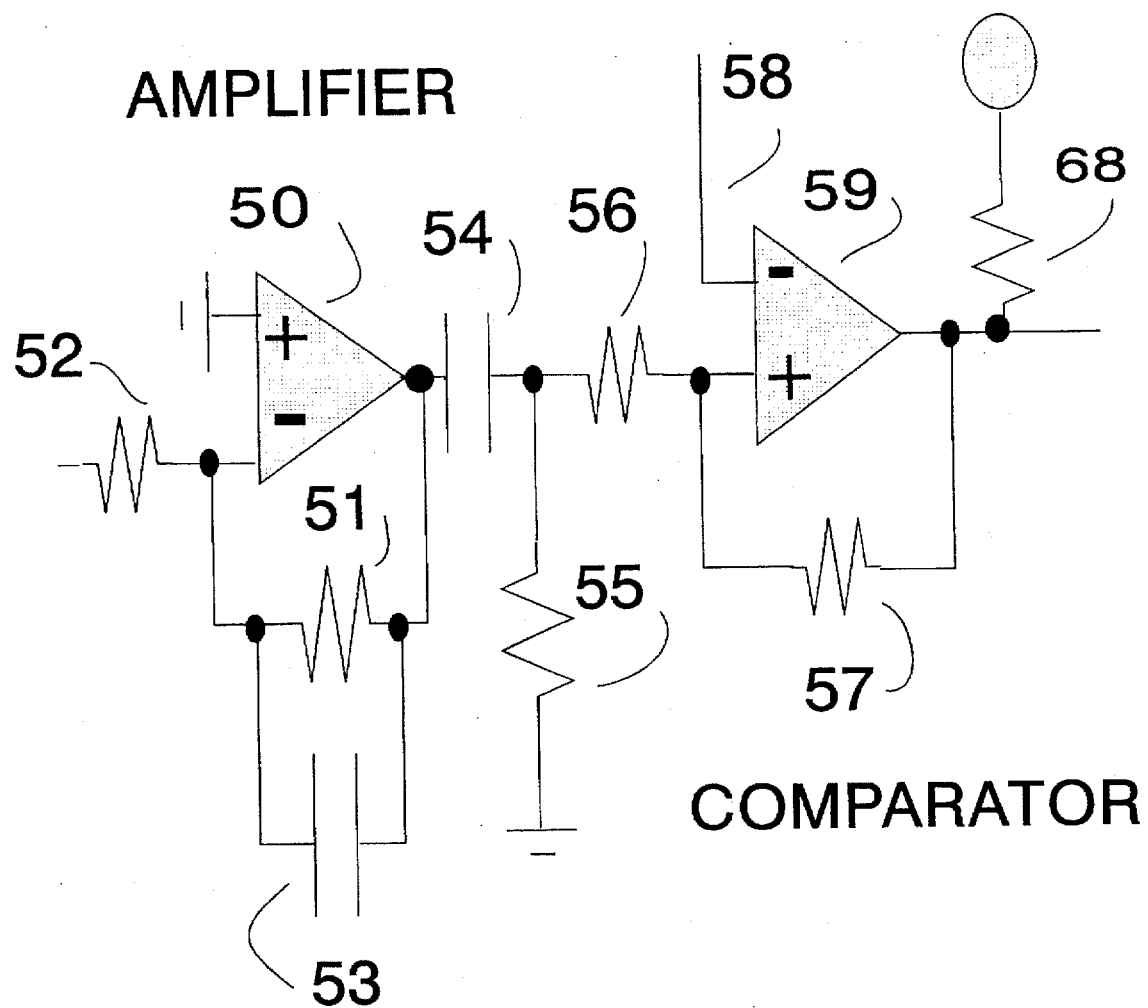
FIG. 4, a schematic of a channel of the sense amplifiers used to sense the pin electronics array of the present invention.
Figure 5:
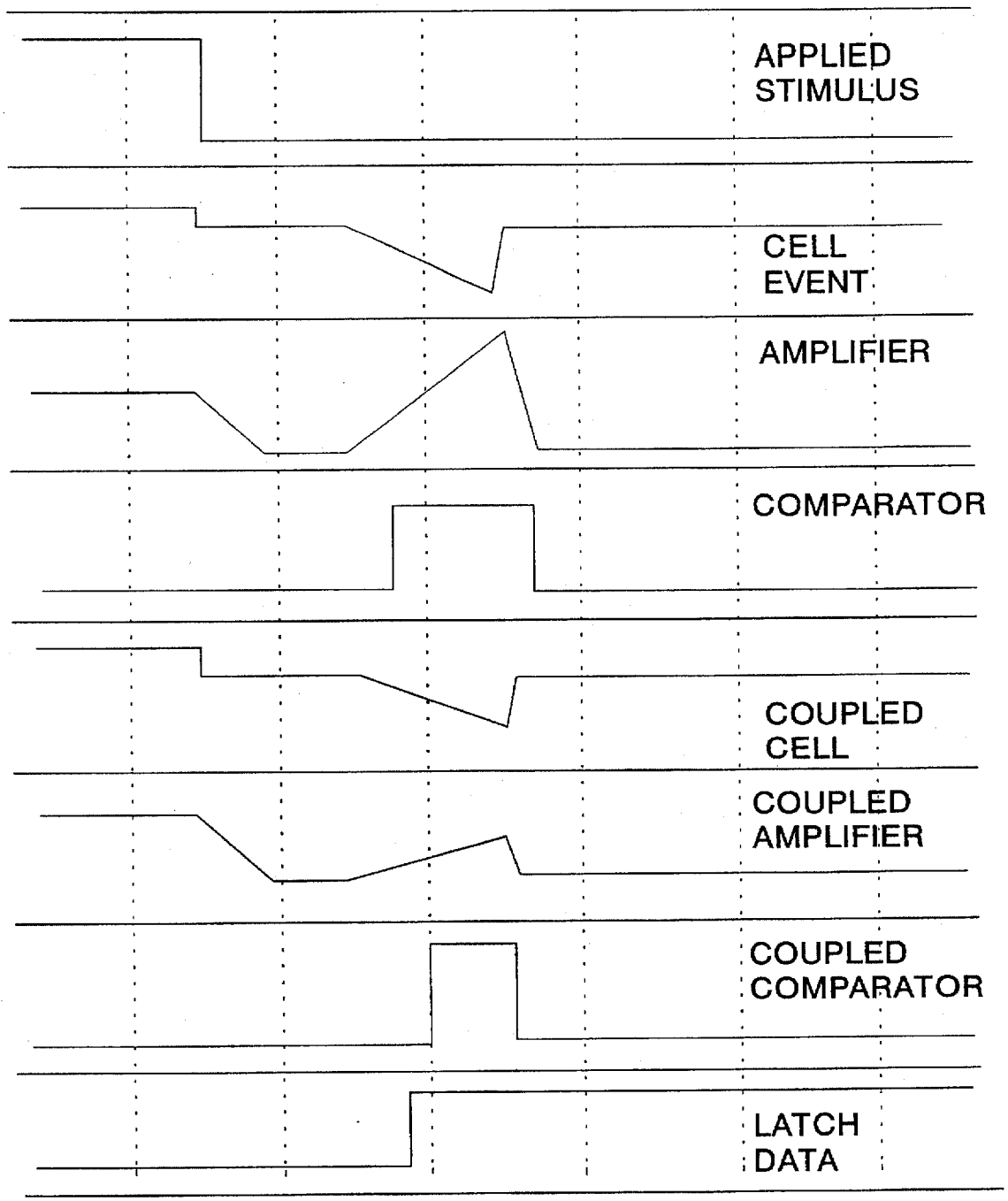
FIG. 5, a diagram of the waveforms occurring in the pin electronics array when an intermittent connection is identified.
Figure 6:
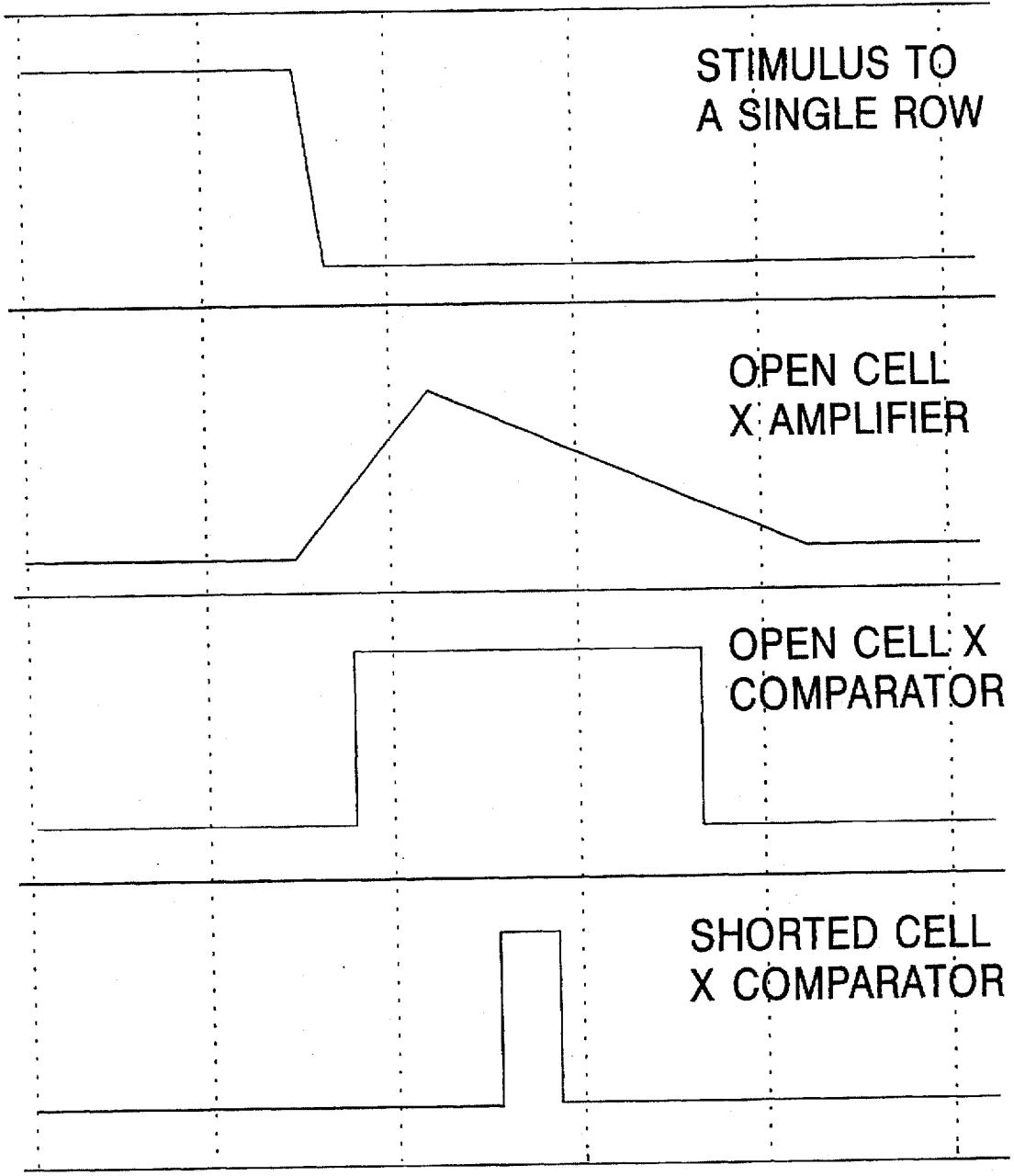
FIG. 6, a diagram of the waveforms in the pin electronics array when a measurement of static continuity is performed.
Figure 7:
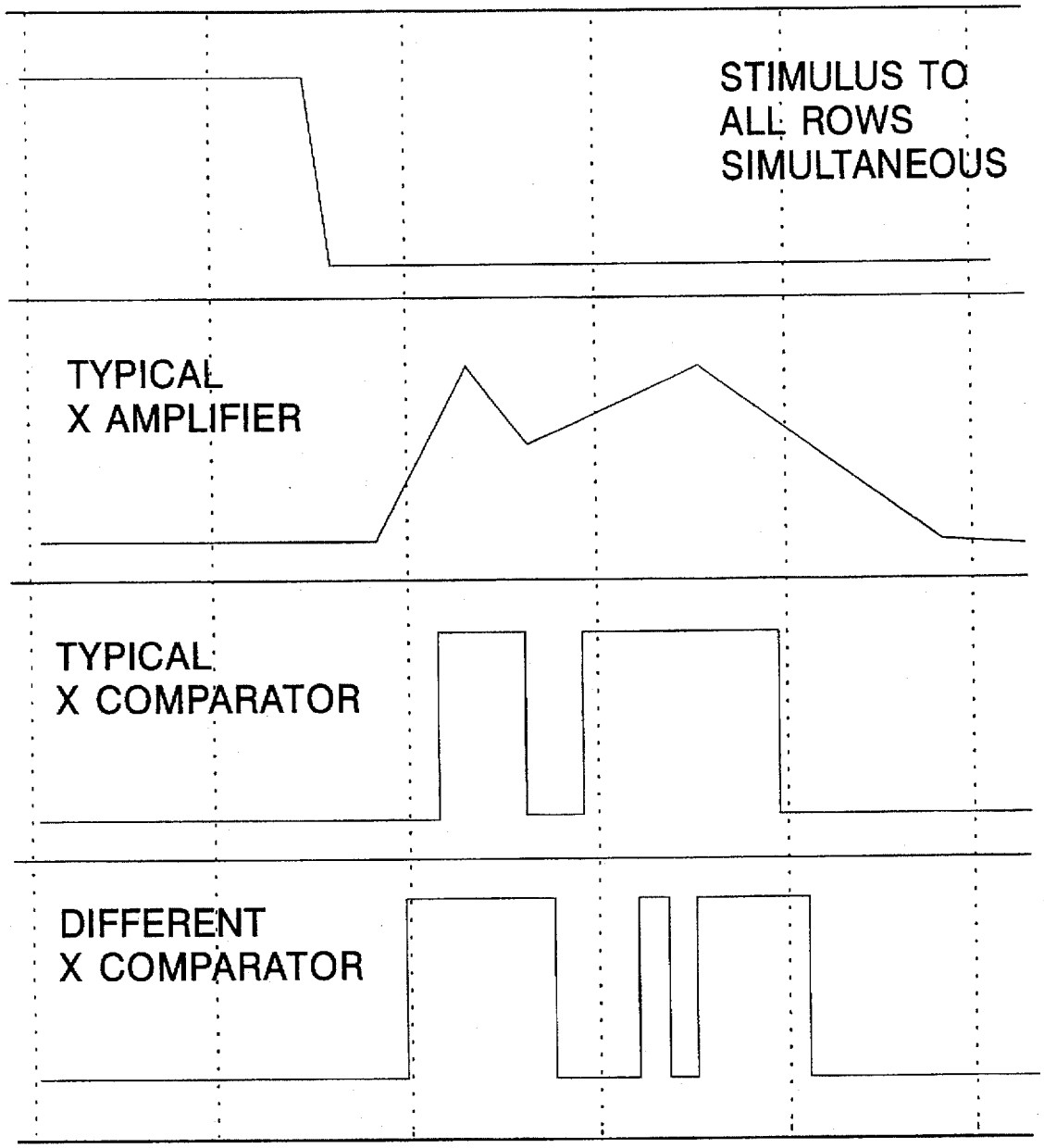
FIG. 7, a diagram of the waveforms in the pin electronics array when a signature pattern is generated from the resistances and capacitances inherent in a harness and system.

Each of the X and Y sense amplifiers comprises an operational amplifier 50 (FIG. 4), with gain set by the ratio of resistor 51 to resistor 52. A pole is introduced into the frequency response of the amplifier by a small feedback capacitor 53. The amplifier output is capacitively coupled through capacitor 54 to the comparator 59. Capacitor 54 acts with resistor 55, as a differentiator at the input of the comparator 59. Resistors 56 and 57 provide a small amount of positive feedback about the comparator 59, introducing a small amount of hysteresis, or schmitt-trigger action, thereby increasing the speed and noise immunity of the circuit. The comparator 59 used in the circuit has an open-collector output requiring an external pullup resistance 68. When the derivative of the amplifier output is greater than a threshold set by the voltage on the comparator reference line 58, the comparator 59 generates an output signal.

The X comparators 21 output is coupled to the X encoder 24, as does the Y comparator 23 output to the Y encoder 26. Each encoder generates a binary code indicating which, if any, of its input lines is active. When a event-valid signal from each of the X encoder 24 and the Y encoder 26 are active, indicating that a single row comparator output and a single column comparator output are both active, the binary codes from both the X encoder 24 and the Y encoder 26 are latched in the event latch 27, and an event-valid flag 27a is set. When the microprocessor 25 finds the event-valid flag 27a is set, the binary codes describing the event are read from the event latch 27 to the microprocessor 25, and the microcomputer generates a suitable indication of the event on its display 60 and on its speech synthesizer 67. The event-valid flag is cleared when the microprocessor reads it, thereby allowing a further event to be latched.

In addition to the signal on the row (Y) and column (X) sense lines connected to the pin electronics cell 31 attached to the wire on which the event occurred, a weaker signal couples from these sense lines, through the capacitors in other cells 31, to other sense lines. A future embodiment of the invention may incorporate a buffer amplifier in each cell to alter this coupling, and may couple the signal to the sense lines through a resistor. The comparator reference line 58 is set or driven, through a trigger level DAC 61, by the microprocessor 25, to a threshold level such that a momentary opens event will be detected by the comparators on the row (Y) and column (X) of the pin electronics cell 31 on which the event occurred. The comparator therefore is equivalent to a threshold detector with a DAC-adjustable threshold. The event code formed by concatenating the output of the X encoder 24 with the output of the Y encoder 26 is latched in the event latch 27 and therefore corresponds to the identity of the pin electronics cell 31 of the pin electronics array 15 connected to the wire of the wiring harness 11 on which the event occurred.

In addition to the comparators for the active sense lines connected to the active cell connected to the faulty wire, other comparators may fire due to weaker signals that couple into other sense lines from the active sense lines. As all signals have a finite risetime, and the coupled signals have the same or a slower risetime than the signal on the active lines, and the coupled signals are weaker than the signal on the active lines, the signal on the active lines will reach the threshold voltage before the signal on the other sense lines. The threshold voltage on reference line 58 is chosen such that the event code for the pin electronics cell connected to the fault wire is loaded into the event latch 27 before any additional comparators fire. The threshold is also chosen such that the comparators will detect only valid events of a selectable event amplitude and duration.

The present invention may be operated as a multichannel static continuity tester by driving the row stimulus lines 35 of all rows to ground. After sufficient time has been provided for the voltages on the sense lines to stabilize, a selected row stimulus line is driven to a non-zero level, such as −2.5 volt. Those pin electronics cells 31 on this stimulus row line 35 will generate a signal inversely proportional to the current that flows through any wire and termination connected to their pins. The comparator reference line 58 is set, through the trigger level DAC 61, to a suitable threshold level such that open pins on the selected row stimulus line generate a comparator output signal in an allotted time, and that pins sourcing a current generate a signal in a greater time. After stimulating the row line, the microprocessor waits the allotted time, reads the comparator outputs, formats the data for display, and saves the comparator output pattern in its memory 65. After sufficient time has elapsed for the voltages on the sense lines to stabilize, the process is repeated for another selected row stimulus line. The pattern of opens and shorts or continuity observed is displayed to the technician row by row, and as an overall pattern for the system. The pattern of opens and shorts for the system is the concatenation of the patterns obtained for each row stimulus line.

In addition to testing opens and shorts, the tester may indicate which pins are connected through a diode, such as a parasitic diode of an integrated circuit, to ground. This is done by first driving a row stimulus line from 0 to a first voltage such that most diode loads will not substantially conduct, such as −0.7 volts. The microprocessor monitors the comparator outputs and derives a pattern of opens and shorts therefrom. The row stimulus line is then driven from the first voltage to a voltage approximately double in magnitude where most diode loads will substantially conduct, such as −1.4 volts. The microprocessor again monitors the comparator outputs and derives a second pattern of opens and shorts therefrom. The differences between the first and second patterns indicates which pins are connected to a diode load, and forms a component of the overall pattern for the system.

The tester can also identify, and measure, a capacitive load by observing the time from a transition of the row stimulus line to a transition of the column sense line comparator output. Similarly, the tester can also measure resistive loads.

In another embodiment of the present invention, rows are stimulated as described above in the multichannel static continuity test mode. Once the row has been stimulated, the microprocessor repeatedly reads the column comparators until the array has stabilized. The microprocessor then processes the data obtained to determine an overall pattern of opens, shorts, and capacitances for the system.

Once an overall pattern is derived for the system under test, the microprocessor 25 compares this pattern with an expected-data pattern for a technician-designated system in a database in its memory 65. Any deviations of the measured pattern from the expected pattern are ranked and displayed.

Should the user request assistance, the microprocessor searches the database for similar patterns. These further patterns include patterns of known good systems and patterns of systems with known, previously identified, faults. Should a match, or a near match, be found, the microprocessor places information on its display 60 regarding the closeness of the match, with text describing the system and fault (if any) of the pattern to which the match was found.

Software neural network techniques are used in matching the system pattern to the patterns in memory because these techniques can identify patterns that are near matches but are not identical to the system pattern.

Prior to operation of the tester, the microprocessor 25 requests, via the display 60, that the technician operating the tester enter, via keyboard 66, an identification of the system under test. If the system pattern does not exactly match the database pattern for the system identified by the technician, and an exact match or a near match is found to a pattern in the database, the microprocessor uses the display 60 to ask the technician to verify the system identification.

The pin electronics array of the present invention also operates as a capacitively coupled neural network. The network has a plurality of input lines, which are the row stimulus lines 14. The network has a plurality of sense lines, the sixteen row (Y) 16 and sixteen column (X) 17 sense lines. The signal on a column sense line is a weighted sum of a transition of the row stimulus lines. Each weight depends on the loads connected to the pins of the pin electronics array 15.

Figure 8:
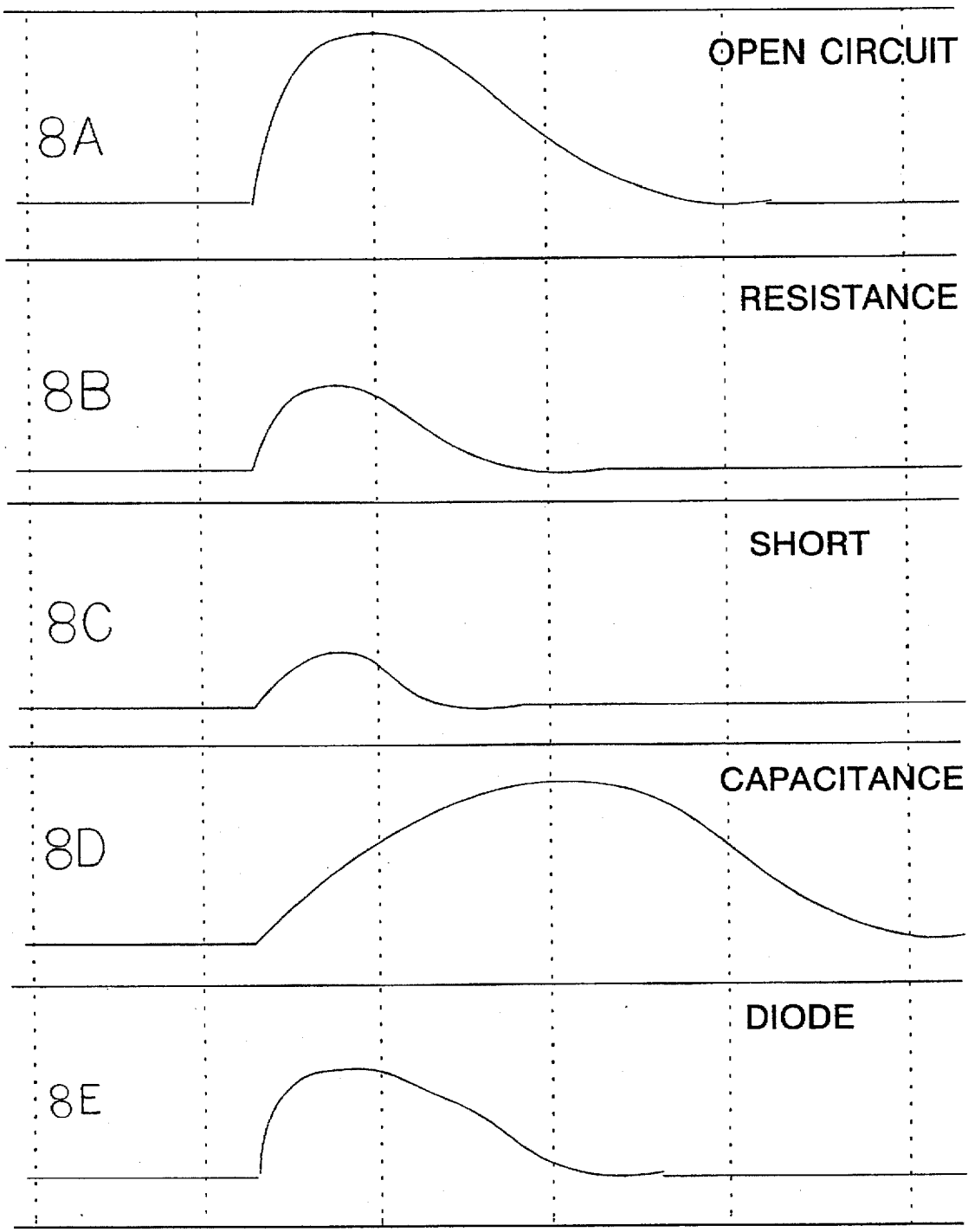
FIG. 8, a waveform diagram showing signals developed with different loads on a pin electronics array cell.

For example, consider a first pin electronics cell 31 having an open circuit load connected to it, and a second pin electronics cell having a forward-biased diode termination load connected to it. A signal on the row stimulus line will couple onto the column and row sense lines more strongly at the cell having the open circuit (FIG. 8a) than from the cell having the diode load (FIG. 8e), which in turn will couple more strongly than a cell having a short-circuited load (FIG. 8c). Similarly, a cell having a highly capacitive load (FIG. 8d) will couple with a signal having a slower initial edge rate than a cell having an open circuited load.

Should two of the row stimulus lines transition together, but in opposite directions (e.g., line A from −2.5 V to 0V, and line B from 0V to −2.5V), the signal on a column sense line will be the sum of the signals coupled through the cell on stimulus line A and the cell on stimulus line B. It is therefore possible to achieve negative, as well as positive, input-weight products in the signal summation on each line.

The pin electronics array therefore forms a neural network, where the weights of the network depend on the loads connected to pins of the array, and the inputs of the network are the stimulus lines 14. Alternatively, the network may be stimulated through the pins of the pin electronics array.

The time that a sense line will take to recover to a threshold level depends on the signal on that line.

The tester of the present invention may be operated in a signature analysis mode. This is done by setting the row stimulus lines to a first pattern, with the stimulus voltage DAC set to a first level, and allowing the circuit to equilibrate. The trigger voltage DAC 61 is set to a suitable threshold value. The stimulus lines are switched to a second pattern, or the stimulus DAC 61 set to a different voltage, and the microprocessor reads and stores in memory the column (X) and row (Y) comparator outputs repeatedly, thereby monitoring a time domain response of the network to the change of the stimulus lines.

The pattern read by the microprocessor is then reduced to a signature dependent on the nature of the of the interaction of the loads connected to the pin electronics array and the stimulus signal. In the presently preferred embodiment, this reduction is accomplished by extracting, for each sense line, a sequence of numbers indicating the length of time for which that sense line remains at each value.

One or more sensed signatures, each indicating the response of a sense line to one or more changes of the stimulus line pattern, are combined to form an overall signature for the system under test. A multiplicity of overall signatures from the same circuit are then combined, as by averaging, to form a composite signature for the circuit.

Once a composite signature is derived for the system under test, the microprocessor 25 compares this signature with further composite signatures in a database in its memory 65. These further composite signatures include signatures of known good systems and also signatures of systems with known, previously identified, faults. The comparison is performed with a software neural network, trained on a multiplicity of signatures from various good and defective systems, allowing near matches to be identified as well as exact matches. Should a match, or a near match, be found, the microprocessor places information on its display 60 regarding the closeness of the match, with text and graphics describing the system and fault (if any) to which the match was found.

In an alternative embodiment of the present invention, the event latch is coupled to receive the outputs of the comparators. In this embodiment, a first OR gate is coupled to receive the sixteen row comparator outputs, and a second OR gate is coupled to receive the sixteen column comparator outputs. The event latch is loaded whenever an AND gate determines that the outputs of the first OR gate and the second OR gate are both true. In this embodiment, the event latch comprises an edge-triggered D-type register, triggered on the positive edge of the AND gate output. To ensure that the event latch loads the correct information, a delay of the OR gates and the AND gate is greater than the setup time of the edge-triggered D-type register.

In this embodiment, the event latch contains data corresponding to all the active row and column sense lines, from which the identity of the active row and column sense lines can be determined by the microprocessor. Therefore, as with the presently preferred embodiment, the register is loaded with data comprising the identity of the row sense line comparator and the column sense line comparator that detected the signal. In the multichannel continuity test mode, the microprocessor utilizes the event latch contents in determining the wire upon which a momentary open event occurred, and displays this information to the technician.

The present invention as described utilizes a two dimensional array of pin electronics cells, organized as rows and columns. The array may, however, be extended to a three (or more) dimensional array wherein a signal from each pin electronics cell may couple into a row sense line, a column sense line, and a plane sense line.

A signature dependent upon the resistances, capacitances, and diode characteristics of the system wires connected to a tester can be derived in other ways. For example, an alternative implementation of an analog signature tester utilizes a custom integrated circuit, built in a 24-pin DIP, having sixteen pin electronics circuits and a serial interface to a microprocessor. Each pin electronics circuit of this implementation contains circuitry to measure the resistance, capacitance, and diode characteristics of any wire attached to the pin electronics circuit. A microprocessor then utilizes this information to compute a signature for the system under test.

The term "pin electronics" is standard in the industry for that portion of a test device replicated for each wire that may be tested at a given time. Each pin electronics module, or cell, has a connection point, or pin, to which an individual wire of the system may be connected. The pin need not be a male connector pin, the traditional integrated circuit tester pin electronics typically connects to a terminal of a female socket or contactor apparatus that connects the "pin" to a wire of the system under test.

Figure 9:
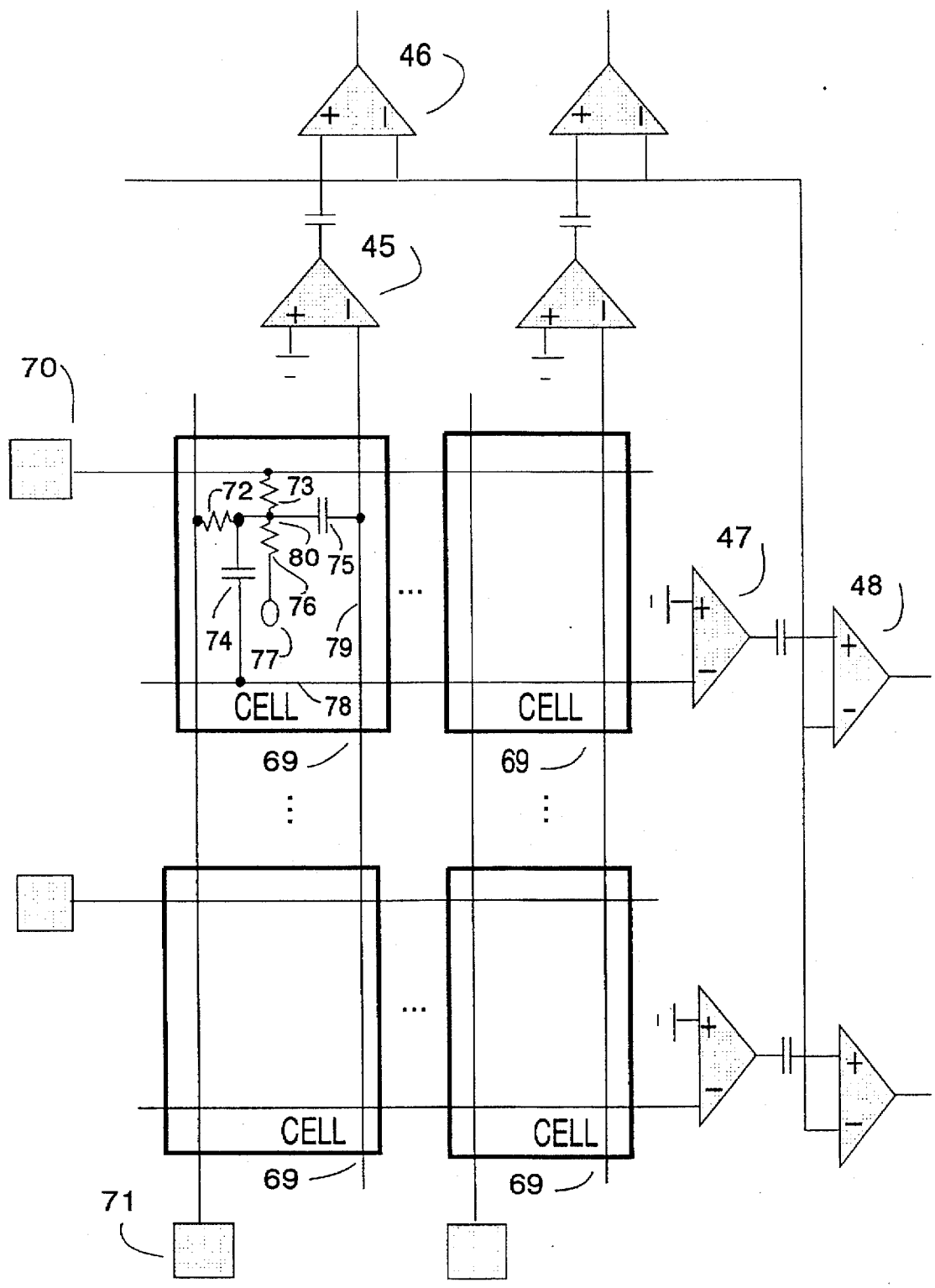
FIG. 9, a partial schematic diagram of an alternative form of the pin electronics array of the present invention having both row and column stimulus lines provided.

An alternative embodiment of the network of the present invention incorporates column stimulus lines as well as row stimulus lines (FIG. 9). This embodiment incorporates a pin electronics cell 69 at the intersection of each row stimulus line 70 and column stimulus line 71. The cell has a resistor 72 connecting the column stimulus line 71 to a node 80 in the cell. Similarly, the row stimulus line 70 connects through a resistor 73 to the node 80. The node 80 is coupled through a capacitor 74 to a row sense line 78, and by a capacitor 75 to a column sense line 79. Node 80 is also coupled by a resistor 76 to the pin 77 of the cell 69.

This alternative embodiment may be operated in the same manner as the preferred embodiment previously described by grounding the column stimulus lines. This embodiment can also be operated in a column-at-a-time static continuity test mode by driving the column stimulus line 71 to a non-ground level, typically −2.5 V, by driving a selected column stimulus line to a non-grounded level while grounding all other column stimulus lines, and grounding the row stimulus lines. This column continuity test mode may provide additional visibility of faults beyond that available with the row continuity test mode alone. Similarly, visibility of the load attached to a particular pin electronics cell may be enhanced by stimulating both the row and column stimulus lines to which that cell 69 is connected.

This alternative embodiment may be stimulated by changes in column stimulus lines to provide additional response patterns in the signature analysis mode.

Figure 10:
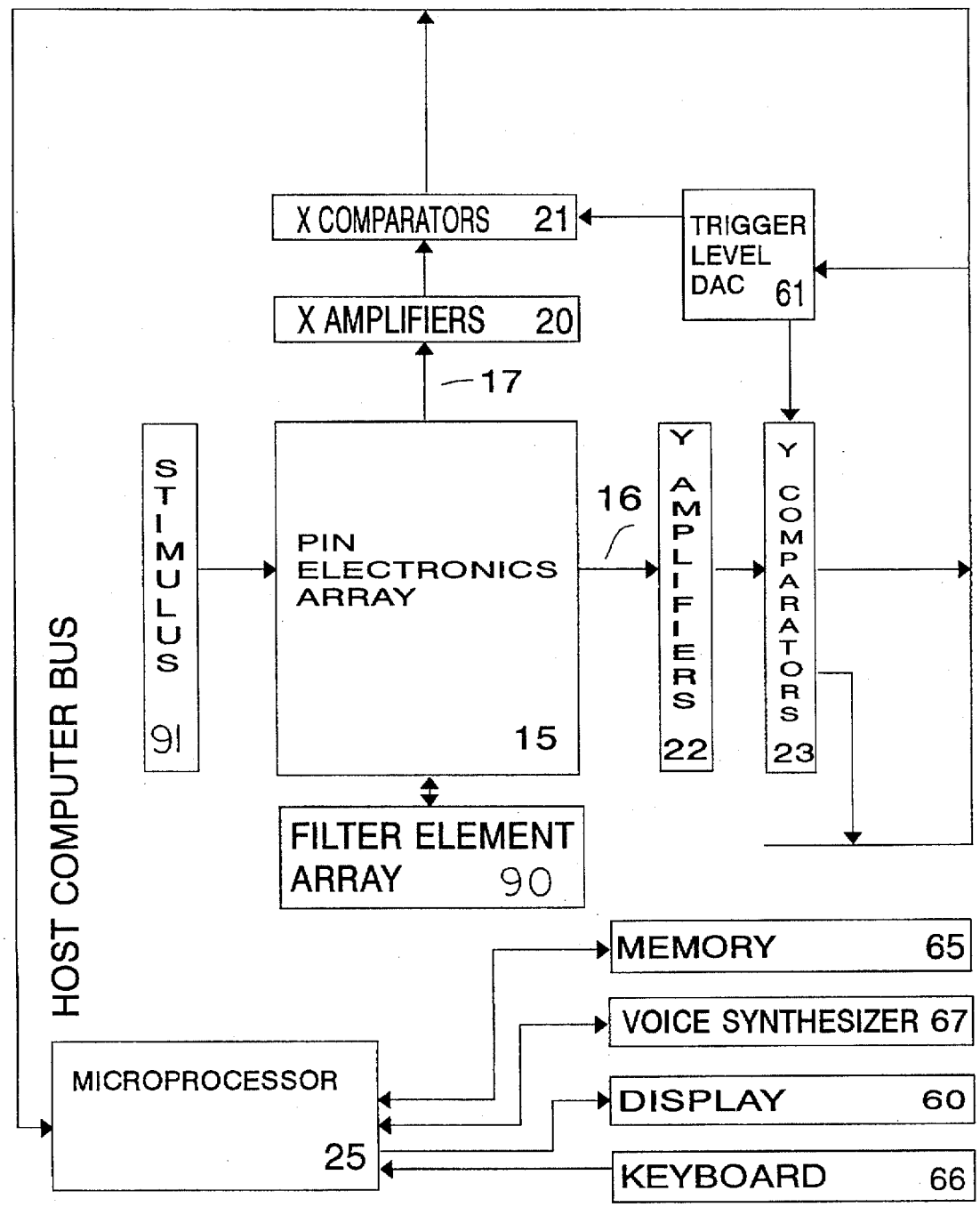
FIG. 10, a block diagram of the system as configured for analyzing characteristics of a signal.

The network of the present invention may also be operated to provide useful information about the nature of a stimulus signal 90, as shown in FIG. 10. In this mode of operation, the unknown signal 91, or signals, corresponding thereto is coupled into the array by coupling it to one or more row stimulus line 35 (FIG. 3), one or more pins 30 of the array 15, or into the enable controls of the analog switches 40. An array of suitable filter elements 90 are then connected to some or all remaining pins 30 of the array 15. The row 23 and column 21 comparators are set to a suitable level by trigger level DAC 61. A signature is then generated by repeatedly sampling the outputs of the row 23 and column 21 comparators and processing this information in the microprocessor 25. A similar signal should produce a similar signature.

Alternatively, useful information about one or more signals may be derived by using an array similar to that of the present invention but where the resistance and capacitance values of the pin electronics cells 30 are not identical from cell to cell. With this alternative, no filter components need be added to the array. The signal is injected into one of the row stimulus lines 14, or preferably into one or more pins 30 of one or more selected pin electronics cell 31. The signal on each of the X and Y sense lines of the cell array is then a function of the signal, and of the resistances and capacitances throughout the array, and will vary from sense line to sense line because of the non-uniform resistances and capacitances throughout the array. The pattern detected by the comparators will therefore be a function of the signal.

In this signal analysis mode, the microprocessor 25 repeatedly samples the comparator outputs and stores the samples into memory. The time-dependant pattern detected by the X 17 and Y 16 comparators and stored in memory by the microprocessor 25 is a function of the waveform of the one or more signals.

The waveform-dependant pattern read by the microprocessor is reduced by the microprocessor to a signature and analyzed by a software neural network in the manner previously discussed in connection with the system signature analysis mode. The software network, when appropriately trained, can distinguish between such signals as a half-sine pulse and a square pulse.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:
1. A tester for testing a system, wherein the system has a plurality of wires, wherein the tester has a plurality of pins each adapted for connection to a wire of the plurality of wires of the system, the tester comprising:

at least one row sense line and at least one column sense line;

an array of pin electronics cells, wherein each pin electronics cell couples a signal to one of the at least one row sense line and one of the at least one column sense line when a change in current flow through a tester pin connected to said pin electronics cell occurs;

apparatus for detecting the signal coupled to the at least one row sense line; and apparatus for detecting the signal coupled to the at least one column sense line.

2. The tester of claim 1, wherein each pin electronics cell further comprises:

a row capacitor coupling the signal into the row sense line;

a column capacitor coupling the signal into the column sense line;

resistance means coupled to pass a current from a stimulus voltage source to the pin of the pin electronics unit.

3. The tester of claim 2, wherein the resistance means comprises a resistor coupled between the stimulus voltage source and a node to which the row and column capacitors are coupled, and a resistor coupled between the node and the pin of the pin electronics cell.

4. The tester of claim 1, wherein the apparatus for detecting when the signal couples to the column sense line further comprises a comparator coupled to receive the signal from the column sense line and to compare the signal with a reference voltage.

5. The tester of claim 1, wherein the at least one row sense line comprises a plurality of row sense lines, and wherein the apparatus for detecting when the signal couples to the row sense line further comprises a plurality of row comparators each coupled to receive the signal from an individual row sense line and to compare that signal with a reference voltage; and further comprising a register, wherein the register is loaded upon a row comparator detecting the signal, and wherein the register is loaded with data comprising the identity of the row comparator that detected the signal.

6. The tester of claim 5 wherein the at least one column sense line comprises a plurality of column sense lines, and wherein the apparatus for detecting when the signal couples to the column sense line further comprises a plurality of column comparators each coupled to receive a signal from an individual column sense line and to compare that signal with a reference voltage, and wherein the register is loaded with data further comprising the identity of the column comparator that detected the signal.

7. The tester of claim 6 wherein the register is loaded upon at least one row comparator and at least one column comparator for simultaneously detecting the signal, the register being loaded with data comprising the identity of the at least one row comparator detecting the signal and the identity of the at least one column comparator detecting the signal.

8. The tester of claim 1, wherein the at least one row sense line comprises a plurality of row sense lines and the at least one column sense line comprises a plurality of column sense lines, and further comprising:

apparatus for coupling a stimulus current to a plurality of the pins of the pin electronics cells attached to a given row sense line; and apparatus for inputting to a processor data from the apparatus for detecting the signal coupled to the at least one column sense line.

9. The tester of claim 8, further comprising a memory containing a database of patterns and a display, wherein the processor compares a pattern of data from the apparatus for detecting the signal coupled to the column sense lines with patterns in the database and places on the display information regarding the best match found.

10. An apparatus for analyzing at least one signal, comprising:

a plurality of cells, each cell having at least two elements, where a first element of the cell is a resistance and a second element is selected from the group consisting of a capacitance and an inductance;

a plurality of column sense lines;

where an element of each cell is coupled to a column sense line;

a plurality of column digitization devices, where each column digitization device is coupled to receive a column sense line and the output of each column digitization device is coupled to be readable by a computing device further comprising a neural network in software or hardware;

where the at least one signal is coupled to drive at least one element of at least one cell;

where the neural network of the computing device extracts information about the at least one signal from the output of the column digitization devices.

11. An apparatus comprising:

a plurality of electronic neuromimes, where each neuromime has a plurality of synapses, each synapse having a pin for the removable connection of additional circuitry thereto and each synapse provides a transfer function from an input to a response function of the neuromime;

a plurality of row stimulus lines, each row stimulus line being coupled to the input of a synapse of each neuromime;

apparatus for observing a response of each neuromime to a signal applied to at least one row stimulus line; and wherein the transfer function of each synapse is a function of the characteristics of any additional circuitry attached to the pin of the synapse.

12. The apparatus of claim 11, further comprising:

apparatus for electrically stimulating the row stimulus lines; and apparatus for monitoring the response of the neuromimes to a stimulus on the row stimulus lines.

13. The apparatus of claim 12, wherein each neuromime further comprises:

a sense line coupled to receive a signal from each synapse of the neuromime;

an amplifier coupled to receive a signal from the sense line; and a comparator coupled to compare an output of the amplifier to a reference signal.

14. The apparatus of claim 12, wherein the coupling of the signal from the row stimulus line into the response function of the neuromime is performed by means comprising at least one capacitor.

15. The apparatus of claim 11, wherein each synapse further comprises:

bias means coupled to admit a current into the pin of the synapse when the row stimulus line coupled to the synapse is stimulated by the apparatus for electrically stimulating the row stimulus lines; and coupling means coupled to insert into the response function of the neuromime a function of the current through the bias means and the voltage on the pin of the synapse.

16. An apparatus comprising:

a plurality of pin electronics cells, each cell having a pin for additional connections, bias means, a first coupling means, and a second coupling means;

a plurality of row sense lines;

a plurality of column sense lines;

where the first coupling means of each cell is coupled to a row sense line, the plurality of cells coupled to a row sense line forming a row of a matrix;

where the second coupling means of each cell is coupled to a column sense line, the plurality of cells coupled to a column sense line forming a column of the matrix;

means for providing a stimulus to at least one pin of the matrix of pin electronics cells; and means of monitoring a plurality of the row and column sense lines for any signal thereon.

17. A tester for testing a system, wherein the system has a plurality of wires each connected to a load, wherein a plurality of wires of the system are each connected to pins of the tester for the duration of a test, the tester comprising:

a neural network comprising
    at least one input line;
    a plurality of sense lines;
    a plurality of sense amplifiers coupled to receive the sense lines;
    a plurality of pin electronics cells, where each pin electronics cell is coupled to transfer a signal from the at least one input line to at least one sense line according to a transfer function, where the transfer function of the pin electronics cell depends on the load on any wire of the system that is attached to a pin of the tester connected to the pin electronics cell;

apparatus for stimulating the neural network; and apparatus for inputting to a processor data corresponding to an output of the sense amplifiers of the neural network.

18. The tester of claim 17, wherein the processor computes a signature based upon the data corresponding to an output of a plurality of the sense amplifiers of the neural network.

19. The tester of claim 18, further comprising a memory containing a database of signatures, wherein the processor compares the signature with the signatures in the database and displays information regarding the best match found.

\* \* \* \* \*